(12) United States Patent
Chen et al.

(10) Patent No.: US 8,928,095 B2
(45) Date of Patent: Jan. 6, 2015

(54) SEMICONDUCTOR DEVICE HAVING REDUCED LEAKAGE CURRENT AT BREAKDOWN AND METHOD OF FABRICATING THEREOF

(71) Applicant: Macronix International Co., Ltd., Hsinchu (TW)

(72) Inventors: Chien-Chung Chen, Pingtung County (TW); Ming-Tung Lee, Taoyun County (TW); Yin-Fu Huang, Taiwan (TW); Shih-Chin Lien, Taipei Country (TW); Shyi-Yuan Wu, Taipei Country (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/969,011

(22) Filed: Aug. 16, 2013

(65) Prior Publication Data

US 2014/0264599 A1    Sep. 18, 2014

Related U.S. Application Data

(60) Provisional application No. 61/778,496, filed on Mar. 13, 2013.

(51) Int. Cl.
*H01L 29/78* (2006.01)
*H01L 21/265* (2006.01)
*H01L 29/08* (2006.01)
*H01L 29/66* (2006.01)
*H01L 29/786* (2006.01)

(52) U.S. Cl.
CPC ...... *H01L 29/0847* (2013.01); *H01L 21/26513* (2013.01); *H01L 29/66772* (2013.01); *H01L 29/78654* (2013.01)
USPC .......................................... 257/408; 438/286

(58) Field of Classification Search
USPC .......................................... 257/408; 438/286
See application file for complete search history.

(56) References Cited

U.S. PATENT DOCUMENTS

2009/0159970 A1* 6/2009 Ichijo et al. ............... 257/343
2010/0102388 A1* 4/2010 Levin et al. ............... 257/343

* cited by examiner

*Primary Examiner* — Daniel Shook
(74) *Attorney, Agent, or Firm* — Alston & Bird LLP (57) ABSTRACT

A semiconductor device having a well, a p well implant bounded at least in part within a substrate by the well, a conductive layer disposed on the substrate, a high voltage n– (HVN–) doped well implanted in the p well implant, a high voltage p doped (HVPD) well implanted in the p well implant, and a drain n– well and a source n– well disposed in the HVN– doped well and HVPD well, respectively, is provided. A method of fabricating the semiconductor device is also provided. In certain embodiments, the method of fabricating the semiconductor device is characterized by implanting the HVN– ions at a first tilt angle and/or implanting the HVPD ions at a second tilt angle.

21 Claims, 11 Drawing Sheets

SEMICONDUCTOR DEVICE HAVING REDUCED LEAKAGE CURRENT AT BREAKDOWN AND METHOD OF FABRICATING THEREOF

CROSS-REFERENCE TO RELATED APPLICATIONS

This application claims priority to U.S. Provisional Application Ser. No. 61/778,496 filed Mar. 13, 2013, the contents of which is fully incorporated herein by reference.

TECHNOLOGICAL FIELD

The present invention generally relates to a semiconductor device having reduced soft leakage current at breakdown. In particular, the present invention relates to a low on resistance semiconductor device having improved soft leakage current at breakdown. The present invention is also directed to a method for fabricating such semiconductor devices.

BACKGROUND

A low voltage metal oxide semiconductor (LV MOS) device is a low on resistance and low voltage transistor whereby low voltages may be supplied by a microcontroller or a mechanical switch, for example. In a non-limiting example, high powered devices may be controlled by low power control mechanisms that can be provided by a low voltage metal oxide semiconductor field effect transistor (LV MOSFET). The threshold voltages of other MOSFET devices are higher requiring a high voltage to trigger the circuit to provide a state to the controlled device. A MOS transistor may be an n-channel metal oxide semiconductor (nMOS) transistor or p-channel metal oxide semiconductor (pMOS) transistor.

Generally, a MOS transistor may have three modes of operation depending upon the terminal voltages. For example, a MOS transistor has terminal voltages $V_g$ (gate terminal voltage), $V_s$ (source terminal voltage), and $V_d$ (drain terminal voltage). The MOS operates in a cutoff mode when a bias voltage $V_{gs}$ between the gate and the source is less than the threshold voltage $V_{th}$ of the MOS transistor. Essentially, in the cutoff mode, no channel develops and the current $I_{ds}$ in the channel region is zero.

In a preferred mode of operation, the MOS operates in a linear mode when the bias voltage $V_{gs}$ exceeds the threshold voltage $V_{th}$ as long as a channel voltage $V_{ds}$ does not exceed a saturation voltage $V_{ds,sat}$. Typically, the saturation voltage is defined as the bias voltage $V_{gs}$ that exceeds the threshold voltage $V_{th}$. The current $I_{ds}$ increases with the channel voltage $V_{ds}$ when the MOS is in the linear mode. Finally, the channel pinches off and the current saturates when the channel voltage $V_{ds}$ exceeds the saturation voltage $V_{ds,sat}$. $I_{ds}$ is independent of $V_{ds}$ when the MOS transistor is in this saturation mode.

A LV MOS may generally be characterized by a reduced relative high specific on resistance (RON) in comparison to a high voltage metal oxide semiconductor (HV MOS) devices. Without intending to be limiting, conventional devices that have improved specific RON result in a degradation in the breakdown voltage. For example, short channel designs that may provide such an effect, can also induce punch through. Thus, conventional changes in the design of the MOS transistor that increase the breakdown voltage tend to also increase the RON. There remains a need in the art for a LV MOS design having a reduced but well-defined RON.

Additionally, there remains a need in the art to reduce the RON without substantially changing a desired breakdown voltage of the MOS transistor. Further, a long-felt need in the art has been to further reduce the size of low voltage semiconductor devices still having distinct but reduced leakage current at breakdown while maintaining a distinct, well defined response to ensure rapid switching speed in changing the state of the device being controlled by the LV MOS device.

BRIEF SUMMARY OF EXEMPLARY EMBODIMENTS

Embodiments of semiconductor devices of the present invention are therefore provided having reduced leakage current and improved breakdown voltage. Indeed, certain embodiments of the invention may be provided that allow the breakdown voltage to be adjusted based upon certain design parameters as provided herein.

An aspect of the invention provides a semiconductor device comprising a substrate, a well region in the substrate, a p well implant bounded at least in part within the substrate by the well region, a conductive layer disposed on the substrate, a high voltage n− (HVN−) doped well implanted in the p well implant extending into a part of the substrate that underlies a portion of the conductive layer; and a high voltage p doped (HVPD) well implanted in the p well implant extending into another part of the substrate that underlies another portion of the conductive layer the HVPD well diametrically opposed to the HVN− doped well.

The semiconductor device may additionally comprise a drain n− well implanted in the HVN− doped well. Moreover, the semiconductor device may comprise a source n− well implanted in the HVPD well.

According to certain various embodiments of the invention, the well region may be any one of a deep n well implant, an n type epitaxy layer, and an n type barrier layer. In certain embodiments of the invention, the substrate and the well may be a silicon on insulation structure. Further, pursuant to these embodiments of the invention, the semiconductor device may additionally comprise shallow trench isolation (STI) regions that are adjacent to the p well implant.

In an embodiment of the invention, there may be a distance between an edge of the conductive layer and an adjacent edge of the drain n− well. In certain embodiments of the invention, the distance is at least about 0.45 µm.

In an embodiment of the invention, a drain n+ well may be implanted in the HVN− doped well adjacent to the drain n− well and/or a source+ well may be implanted in the HVPD well adjacent to the source n− well. Further, pursuant to these embodiments of the invention, the semiconductor device may additionally comprise a bulk p+ well implanted in the HVPD well to define a contact point for the bulk region.

In an embodiment of the invention, a semiconductor device is provided comprising a substrate; a well, an n well implant bounded within the substrate by the well; a conductive layer disposed on the substrate, a high voltage p− (HVP−) doped well implanted in the n well implant extending into a part of the substrate that underlies a portion of the conductive layer; a high voltage n doped (HVND) well implanted in the n well implant extending into another part of the substrate that underlies another portion of the conductive layer, the HVND well diametrically opposed to the HVP− doped well; a drain p− well implanted in the HVP− doped well; and a source p− well implanted in the HVND well.

Further pursuant to this embodiment, the well may be any one of a deep p well implant, a p type epitaxy layer, and a p type barrier layer. In alternative embodiments of the invention, the substrate and the well may be a silicon on insulation structure. Further, pursuant to these embodiments of the invention, the semiconductor device may additionally comprise shall trench isolation regions that are adjacent to the n well implant.

According to an embodiment of the invention, distance between an edge of the conductive layer and an adjacent edge of the drain p– well may be at least about 0.45 µm.

Another aspect of the invention provides methods of fabricating a semiconductor device, the method comprising providing any one of a substrate having a deep n well, a substrate having an n type epitaxy well, a substrate having an n type barrier layer, and a silicon on insulator substrate structure; forming a deep n well implant in the substrate; forming a p well implant in the substrate, the p well implant diametrically opposed to the deep n well implant; disposing a conductive layer on the substrate; implanting an n– type ion in the p well implant to form a high voltage n– (HVN–) doped well; implanting a p type ion in the p well implant to form a high voltage p doped (HVPD) well; and implanting a drain n– well into the HVN– doped well.

The method of fabricating a semiconductor device may additionally comprise implanting a source n– well into the HVPD well. According to certain embodiments of the invention, implanting an n– type ion in the p well may comprise implanting the n– type ion in the p well at a first tilt angle. Additionally, implanting a p type ion in the p well may additionally comprise implanting the p type ion in the p well at a second tilt angle. In certain embodiments of the invention, the first tilt angle may be from about 15 degrees to about 45 degrees. In certain embodiments of the invention, the second tilt angle may be from about 15 degrees to about 45 degrees. In an embodiment of the invention, the drain n– well may be implanted into the HVN– doped well at a distance that is at least about 0.45 µm from an adjacent edge of the conductive layer.

The method of fabricating a semiconductor device may additional comprise implanting a p+ type ion to form a drain p+ well adjacent to the drain n– well and/or to form a source p+ well adjacent to the source n– well.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a semiconductor device" includes a plurality of such semiconductor devices.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

The inventors have conceived of a semiconductor device for reducing the specific on resistance without substantially affecting the breakdown voltage. An embodiment of the invention is a semiconductor device design that reduces or appreciably eliminates soft leakage current at breakdown. For example, in a design of a certain semiconductor device of the invention, soft leakage current experienced at the drain site junction is substantially reduced or, according to certain embodiments of the invention, substantially eliminated altogether.

Another aspect of the invention provides a method for fabricating or manufacturing a semiconductor device. Generally, the method of fabricating a semiconductor device, according to certain embodiments of the invention, may include preparing substrate of silicon wafer or providing a silicon wafer having a substrate. The method of fabricating a semiconductor device may include implanting a deep n well implant, implanting a p well, and applying a field oxide (FOX) layer using, for example, an applied oxide definition (OD) layer. For example, the step of applying the FOX layer typically involves defining the oxide deposition. This definition may include, for example, using a nitride film to define the hard the mask prior to application of the oxide of the field oxide process.

The method of fabricating a semiconductor device may additionally comprise implanting a $V_T$ ion. The $V_T$ ion may be implanted by allowing the field oxide layer to at least in part act as an implant mask, for example. The implant energy of the $V_T$ ion implant may be such that the $V_T$ ion implantation does not substantially penetrate the substrate below the field oxide layer. $V_T$ ion implantation may result in the implantation of an impurity into the substrate. An ion implantation may then be performed using a material that impedes diffusion of the $V_T$ ion implant.

Depositing an oxide layer may follow implanting the $V_T$ ion. In an exemplary embodiment of the invention, the oxide layer may be a gate oxide layer, and a conductive layer may then be applied to the oxide layer. In an embodiment of the layer, the method of fabricating a semiconductor device comprises applying a polysilicon layer as a conductive layer, for example.

Photolithography may then be used to define another implant area for a high voltage n– (HVN–) ion implant. A HVN– photoresist may be used, at least in part, to define the area where the HVN– implant will be implanted into the substrate.

Figure 1:
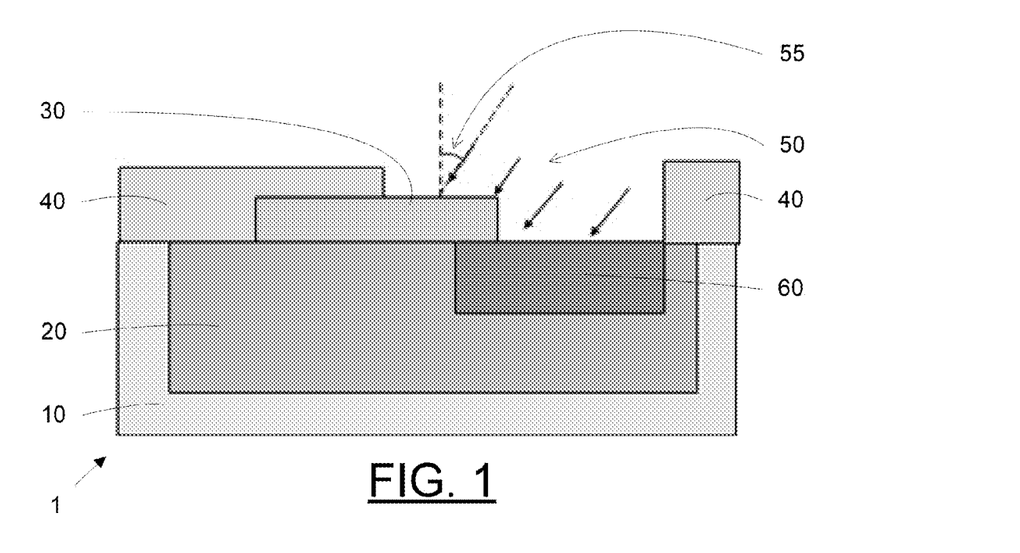
FIG. 1 is a cross-sectional view illustrating a low-voltage n-channel metal oxide semiconductor (LV nMOS) device according to an embodiment of the invention.

FIG. 1 is an exemplary illustrative embodiment of a cross-section of a MOS device according to an embodiment of the invention as an HVN– ion is being implanted into the substrate. In particular, FIG. 1 shows a cross-section of a low voltage n type metal oxide semiconductor (LV nMOS) device pursuant to this illustrative embodiment of the invention. The LV nMOS 1 of FIG. 1 is defined by a deep n well 10, a p well 20, a conductive layer 30, and HVN– photoresist 40. The deep n well 10 and the p well 20 may be implants disposed in a substrate. According to an embodiment of the invention, the p well 20 may be bounded within the substrate or surrounded in part by the deep n well 10, as illustrated in the embodiment represented by FIG. 1, for example. The conductive layer 30, according to certain embodiments of the invention, is disposed, at least in part, across the substrate.

The HVN– photoresist 40 is provided, at least in part, to define a region, the high voltage n– (HVN–) doped well 60, where the HVN– implant 50 is directed. In the illustrative embodiment represented by FIG. 1, the conductive layer 30 also defines the HVN– doped well 60 where the HVN– ion is to be implanted. I.e., the HVN– ion may be aligned using a self-aligned implantation procedure.

In an embodiment of the invention, the HVN– implant 50 may be implanted using a conventional implant procedure. In certain embodiments of the invention, the HVN– implant 50 may be implanted using a chain implant procedure. For example, a chain implant procedure comprises a plurality, e.g., at least two, of implants. In certain embodiments of the invention, these plurality of implants may be performed at substantially the same energies. In other embodiments of the invention, the energies of implant of at least two of the plurality of implants are different. In certain embodiments of the invention, the energies of implant of the plurality of implants to achieve an targeted profile or distribution of HVN– ion deep within the substrate, at a middle portion of the substrate, and at the surface of the substrate. The profile of HVN– may be such that a profile at the junction is smooth or somewhat continuous.

In an embodiment of the invention, the tilt angle 55, which defines the angle the HVN– ions are implanted relative to a vertical line that is substantially perpendicular to the surface of the substrate where the ion is to be implanted, is about zero. I.e., in certain embodiments of the invention, the HVN– ions are implanted with approximately no tilt angle. In certain embodiments of the invention, the tilt angle is at least about 7°, at least about 15°, at least about 30°, at least about 45°, or at least about 60°. In other certain embodiments of the invention, the tilt angle may be from about 15° to about 30°. In yet certain other embodiments of the invention, the tilt angle may be from about 30 degrees to about 60 degrees.

For example, without intending to be limiting, an implantation that is substantially free of tilt may be used to avoid punch in short channel lengths. The inventors have conceived that soft current leakage may be reduced by additionally implanting HVN– ions into a part of the substrate that underlies or is beneath a portion of the conductive layer 30 as illustrated, for example, in FIG. 1. In certain embodiments of the invention, these additional HVN– implant ions may be distributed into the portion of the conductive layer by using and implantation process that comprises implanting the HVN– ions using a tilt angle as described herein. The inventors have conceived that a degradation of breakdown voltage will not result even though the channel length is effectively reduced as a result of implanting HVN– ions into this part of the substrate underlying this portion of the conductive layer 30.

In embodiments of the invention where the HVN– implant 50 is implanted using a chain implant, the tilt angle of any or all of the plurality of the implants of the chain may be different. Indeed, according to an embodiment of the invention, the tilt angle of at least one of the implants of the plurality of implants may be about 0°, i.e., substantially free of tilt, while the tilt angle of any of the other implants may be within any of the ranges provided herein.

Figure 2:
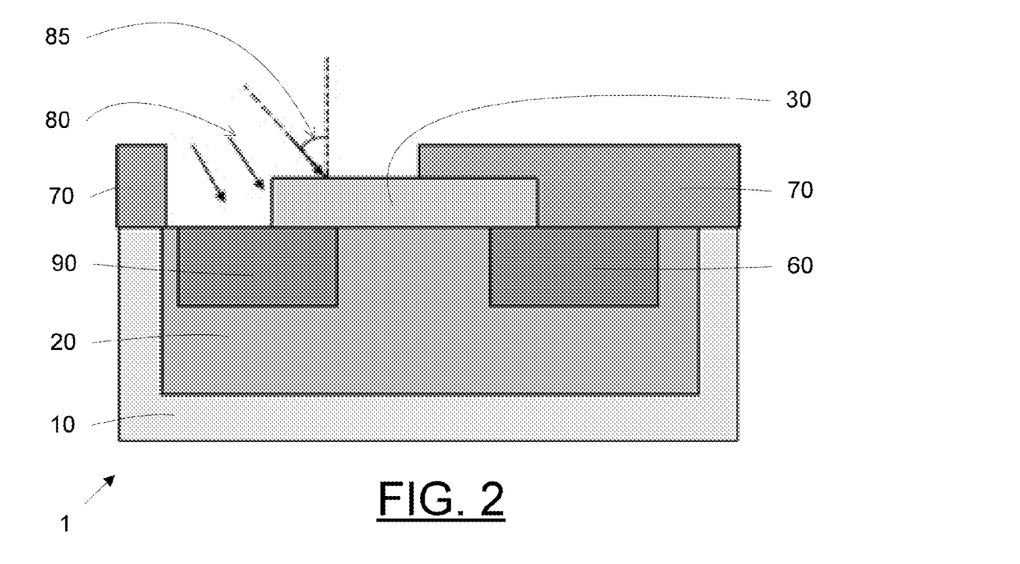
FIG. 2 is a cross-sectional view illustrating a LV nMOS device according to another embodiment of the invention.

The method of fabricating the semiconductor may then comprise the steps of removing the HVN– photoresist 40 and applying a high voltage p doped (HVPD) photoresist 70, as shown in FIG. 2, to implant a high voltage p ion. The HVPD photoresist 70 may define, according to an embodiment of the invention, a region, i.e., the high voltage p doped (HVPD) well 90 where the HVPD ions are implanted. In certain embodiments of the invention, e.g., using a self-aligned implantation procedure, the conductive layer 30 also defines where HVPD ions are implanted in the HVPD well 90. As shown in the illustrative embodiment of FIG. 2 the HVN– doped well 60 is diametrically opposed to the HVPD well 90 within the p well 20.

In an embodiment of the invention, the HVPD implant 80 may be implanted using a conventional implant procedure. In certain embodiments of the invention, the HVPD implant 80 may be through the use of a chain implant procedure. For example, a chain implant procedure comprises a plurality of implants, e.g., at least two implants. In certain embodiments of the invention, these plurality of implants may be performed at substantially the same energies. In other embodiments of the invention, the energies of implant of at least two of the plurality of implants are different. In certain embodiments of the invention, the energies of implant of the plurality of implants to achieve a targeted profile or distribution of HVPD ion deep within the substrate, at a middle portion of the substrate, and at the surface of the substrate. The profile of HVPD may be such that a profile at the junction is smooth or somewhat continuous.

As illustrated in the embodiment of FIG. 2, an other tilt angle 85, may be about zero. I.e., in certain embodiments of the invention, the HVPD ions are implanted with approximately no tilt angle. In other embodiments of the invention, the tilt angle for HVPD implantation is in a range of from about 0° to about 20°. In an embodiment of the invention, the tilt angle for HVPD implantation is about 7°.

Without intending to be bound by theory, the inventors have conceived that soft current leakage may be reduced by additionally implanting the HVPD ions into a part of the substrate that underlies or is beneath a diametrically opposed portion of the conductive layer 30 as illustrated, for example, in FIG. 2. The diametrically opposed portion of the conductive layer may be opposite to a side of the conductive layer 30 where HVN– implant ions are disposed in the substrate underneath the portion of the conductive layer 30, according to an embodiment of the invention. In certain embodiments of the invention, these additional HVPD implant ions may be distributed into the portion of the conductive layer by using and implantation process that comprises implanting the HVPD ions using the other tilt angle as describe herein. The inventors have conceived that a degradation of breakdown voltage will not result even though the channel length is effectively reduced as a result of implanting HVPD ions into this part of the substrate underlying this other portion of the conductive layer 30.

Following implantation of the HVPD implant and removal of the HVPD photoresist, an N– photoresist is applied to the semiconductor device. An implantation of n– ions results in a drain n– well 120 disposed in the HVN– doped well 60 and a source n– well 130 disposed in the HVPD well 90 as illustrated in the exemplary embodiment of FIG. 3 additionally showing the N– photoresist 100 and the N– implant 110.

The method of fabricating a semiconductor device may additionally comprise applying a P– photoresist and forming one or more p– wells, and depositing a silicon dioxide layer, for example, from a vaporized source reactant such as tetraethylorthosilicate (TEOS) followed by an etching such as, for example, a surface plasmon resonance (SPR) etch. An N+ photoresist may then be applied, and one or more n+ wells may be implanted into the substrate. A P+ photoresist may also be applied, and one or more p+ wells may be implanted into the substrate. An interlayer-dielectric film such as a borophosphosilicate glass (BPSG) film, for example, may be applied to the semiconductor device. The method of fabricating the semiconductor device may additionally comprise applying a heat treatment process to the semiconductor device such as, for example, a rapid thermal process (RTP). A semiconductor thermoplastic dielectric (STD) process may also be performed on the semiconductor device as additional layers are applied to the semiconductor device.

Figure 16:
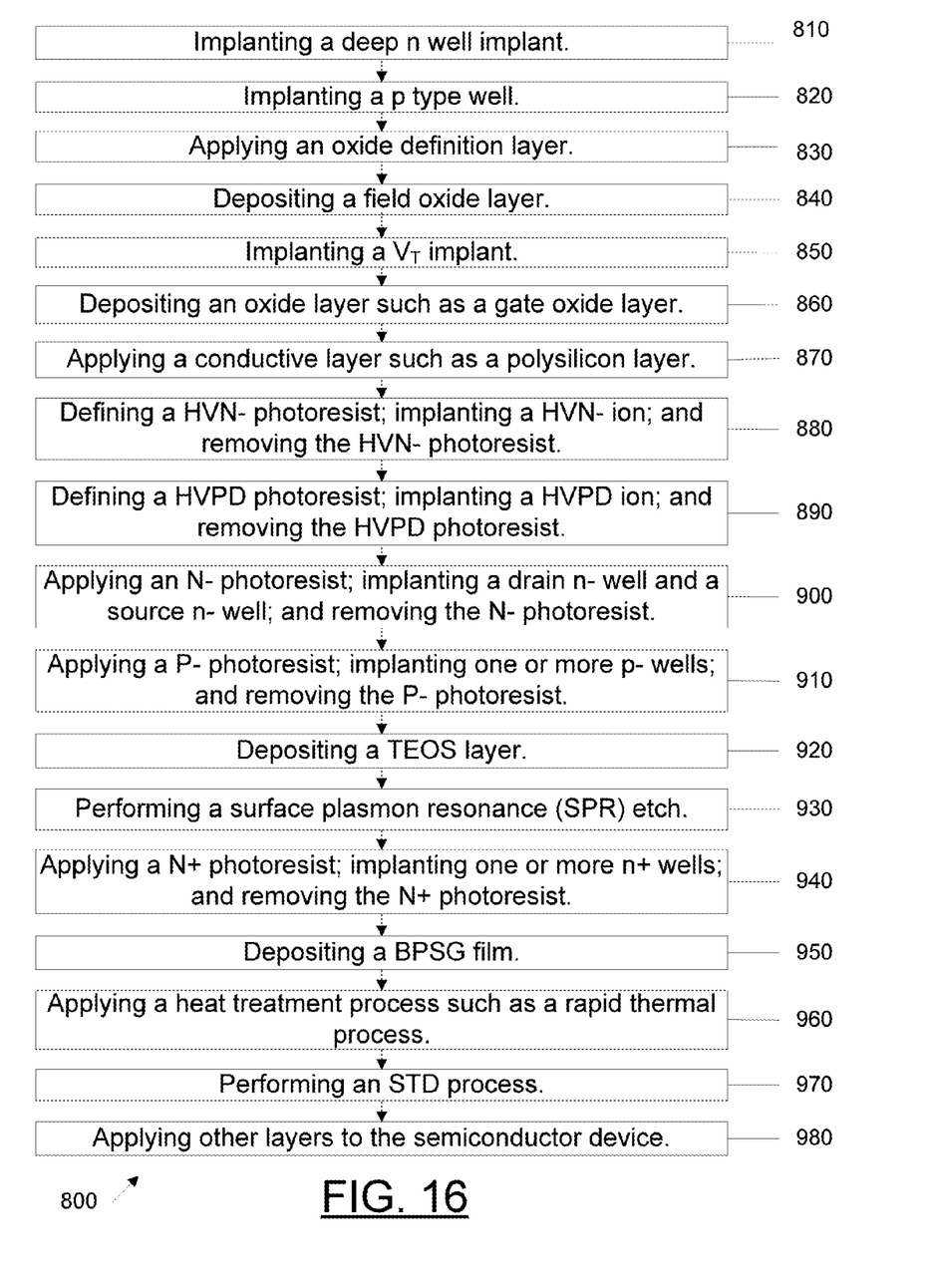
FIG. 16 is a process flow diagram showing the various steps of fabricating a semiconductor device, according to an embodiment of the invention.

The flowchart in FIG. 16 summarizes the processing steps in a method of fabricating a semiconductor device 800, according to an embodiment of the invention.

Figure 4:
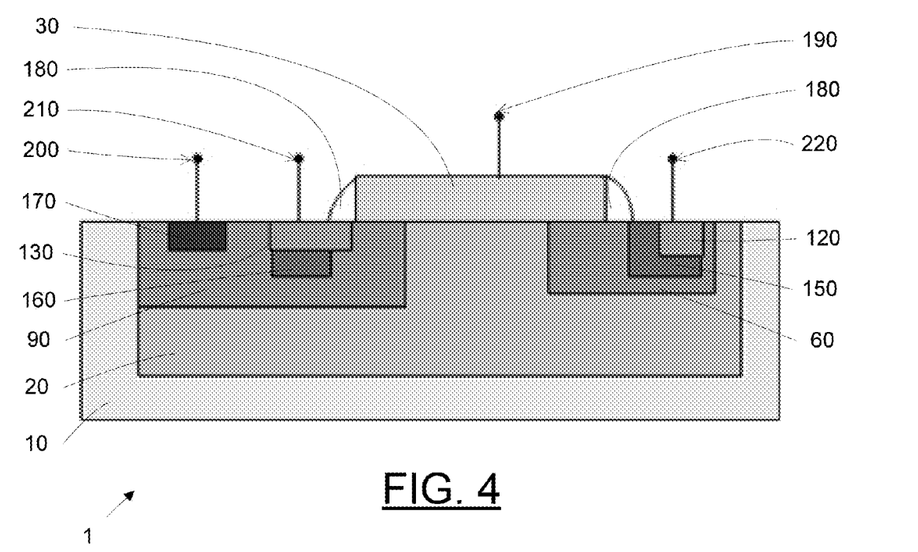
FIG. 4 is a cross-sectional view illustrating a LV nMOS device according to another embodiment of the invention.

FIG. 4 is a cross-sectional view illustrating a LV nMOS device according to another embodiment of the invention. According to this exemplary embodiment of the invention, the semiconductor device 1 has a defined gate region 190, bulk region 200, source region 210, and drain region 220.

The semiconductor device 1 comprises a deep n well 10, a p well 20, a conductive layer 30 flanked by spacers 180, a HVN– doped well 60, and a HVPD well 90. The HVN– doped well 60, according to certain embodiments of the invention, is an "angled" HVN– doped well—i.e., the HVN– doped well 60 has been implanted into the substrate of the semiconductor device using a tilt angle. Additionally, the HVPD well 90, according to certain embodiments of the invention, is an "angled" HVPD well—i.e., the HVPD well 90 has been implanted into the substrate of the semiconductor device using an other tilt angle.

According to the exemplary embodiment illustrated in FIG. 4, the semiconductor device 1 additionally comprises a drain n– well 120 implanted into the HVN– doped well 60 and a source n– well 130 implanted into the HVPD well 90. A drain n+ well 150 is adjacent to the drain n– well 120 in the HVN– doped well 60, and a source n+ well 160 is adjacent to the source n– well 130 in the HVPD well 90. A bulk p+ well 170 disposed in the HVPD well 90 defines a contact point for the bulk region 200.

Figure 3:
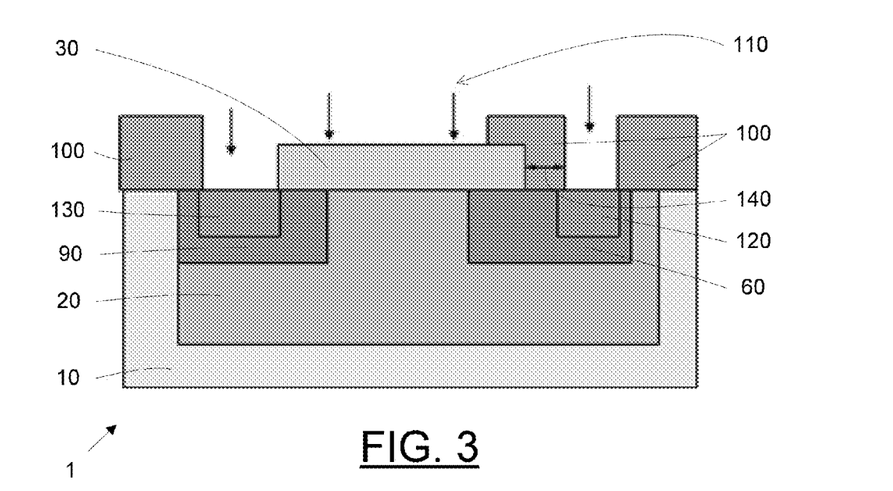
FIG. 3 is a cross-sectional view illustrating a LV nMOS device according to another embodiment of the invention.
Figure 5:
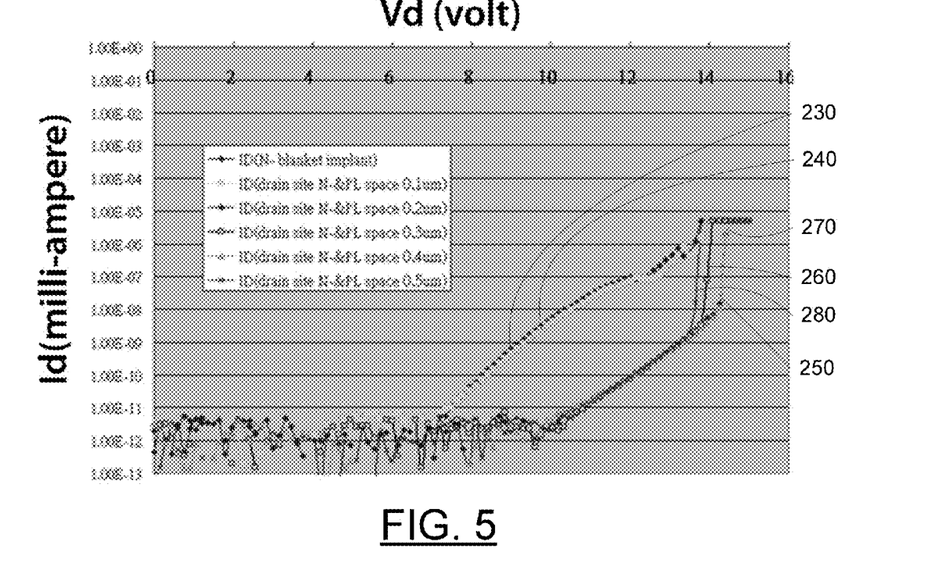
FIG. 5 is a graphical representation of the drain-source voltage to the drain-source current in an exemplary semiconductor device of the invention.

As show in FIG. 3, a width 140 defines a distance between a terminating edge of the conductive layer 30 and an adjacent edge of the drain n– well 120. This width 140 and resulting distance may be substantially controlled by the N– photoresist layer 100 in this region. FIG. 5 is a graphical representation of multiple curves of the drain-source voltage to the drain-source current as the width 140 is varied. The graph of FIG. 5 shows that, according to certain embodiments of the invention, the width 140 and resulting distance is at least about 0.3 at least about 0.4 or at least about 0.45 µm. In certain other embodiments of the invention, the width 140 and resulting distance ranges from about 0.4 to about 0.5 µm or from about 0.45 µm to about 0.5 µm.

Figure 6:
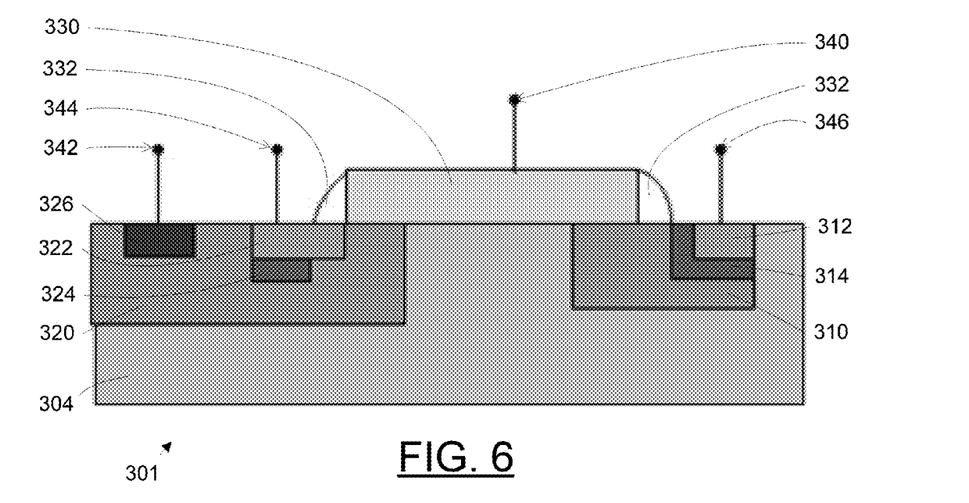
FIG. 6 is a cross-sectional view illustrating a low-voltage p-channel metal oxide semiconductor (LV pMOS) device according to an embodiment of the invention.

According to certain embodiments of the invention, the semiconductor device may be a low voltage p channel metal oxide semiconductor (LV pMOS) device. FIG. 6 illustrates a LV pMOS semiconductor device 301 comprising an n well 304, a conductive layer 330 having adjacent spacers 332, a HVP– doped well 310, and a HVND well 320. A drain p– well 312 and an adjacent drain p+ well 314 are disposed in the HVP– doped well 310, and a source p– well 322 and an adjacent source p+ well 324 are disposed in the HVND well 320. A bulk n+ well 326 disposed in the HVND well 320 defines a contact point for a bulk region 342. The LV pMOS semiconductor device 301 is additionally defined by a gate region 340, a source region 344, and a drain region 346. The LV pMOS semiconductor device 301 of FIG. 6 may be manufactured using the methods of the invention but by substituting p and n type ions as appropriate.

Additional embodiments of semiconductor devices of the invention that may be manufactured using the methods of the invention are further described herein. Embodiments of these devices may pertain to n type devices or complementary p type devices. As adopted further herein, the n type form of the semiconductor device will be described while the complementary p type device will be listed in parenthesis. I.e., in describing the semiconductor device identifying a source n(p)– well, the n type semiconductor device will comprise an n– well, while the p type semiconductor device will comprise a p– well. Additionally, in describing a semiconductor device identifying HVP(N)D well, the n type semiconductor device will comprise a HVPD well, while the p type semiconductor device will comprise a HVND well.

Figure 7:
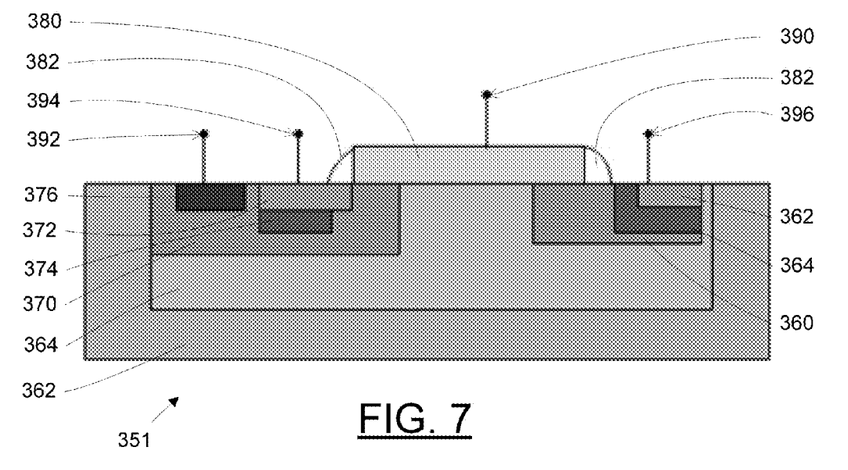
FIG. 7 is a cross-sectional view illustrating a low-voltage n(p)-channel metal oxide semiconductor (LV n(p)MOS) device according to another embodiment of the invention.

FIG. 7 is a cross-sectional view illustrating a low voltage n(p) channel metal oxide semiconductor (LV n(p)MOS) device according to another embodiment of the invention The LV n(p)MOS device 351 comprises a deep n(p) well 362, a p(n) well 364, a conductive layer 380 having adjacent spacers 382, a HVN(P)– doped well 360, and a HVP(N)D well 370. A drain n(p)– well 362 and an adjacent drain n(p)+ well 364 are disposed in the HVN(P)– doped well 360, while a source n(p)– well 372 and an adjacent source n(p)+ well 374 are disposed in the HVP(N)D well 370. A bulk p(n)+ well 376 disposed in the HVP(N)D well 370 defines a contact point for a bulk region 392. The LV n(p)MOS semiconductor device 351 is additionally defined by a gate region 390, a source region 394, and a drain region 396. The deep n(p) well 362 of FIG. 7 is characterized as being implanted using thermal diffusion process. In certain embodiments of the invention, the deep n(p) well 362 of FIG. 7 may be implanted using a high energy process.

Figure 8:
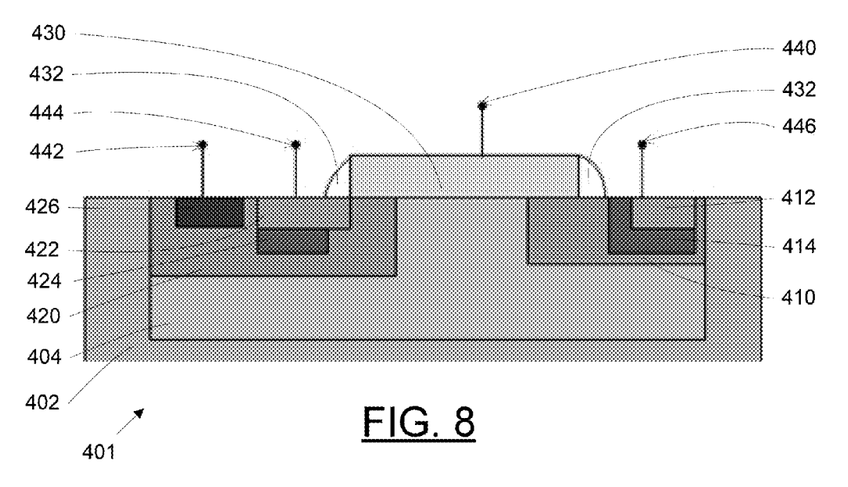
FIG. 8 is a cross-sectional view illustrating a LV n(p)MOS device according to another embodiment of the invention.

FIG. 8 is a cross-sectional view illustrating a LV n(p)MOS device according to another embodiment of the invention. The LV n(p)MOS device 401 comprises an n(p) epitaxy layer or some other n(p) type barrier layer 402, a p(n) well 404, a conductive layer 430 having adjacent spacers 432, a HVN(P)– doped well 410, and a HVP(N)D well 420. A drain n(p)– well 412 and an adjacent drain n(p)+ well 414 are disposed in the HVN(P)– doped well 410, while a source n(p)– well 422 and an adjacent source n(p)+ well 424 are disposed in the HVP(N)D well 420. A bulk p(n)+ well 426 disposed in the HVP(N)D well 420 defines a contact point for a bulk region 442. The LV n(p)MOS semiconductor device 401 is additionally defined by a gate region 440, a source region 444, and a drain region 446.

Figure 9:
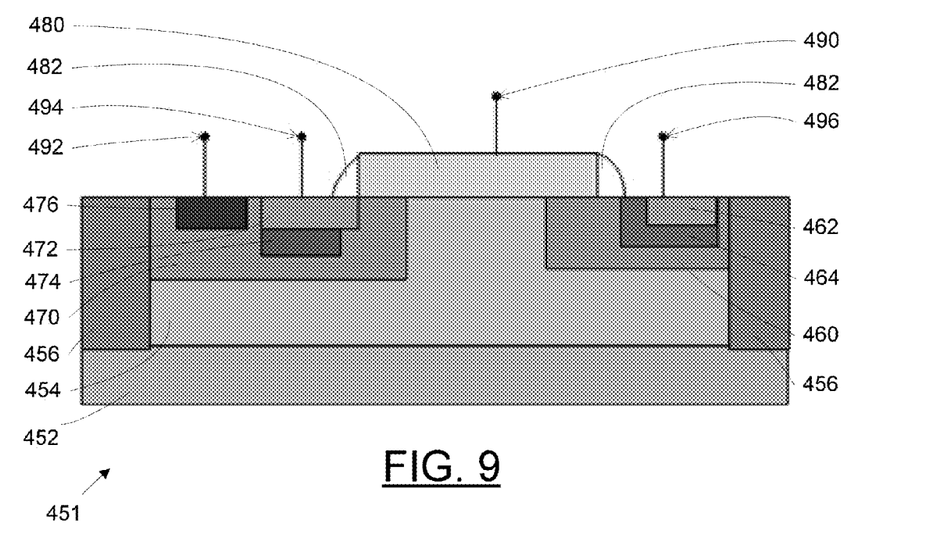
FIG. 9 is a cross-sectional view of a LV n(p)MOS device according to another embodiment of the invention.

FIG. 9 is a cross-sectional view of a LV n(p)MOS device according to another embodiment of the invention. The LV n(p)MOS device 451 comprises an n(p) epitaxy layer or some other n(p) type barrier layer 452, a p(n) well 454, a conductive layer 480 having adjacent spacers 482, a HVN(P)– doped well 460, and a HVP(N)D well 470. A drain n(p)– well 462 and an adjacent drain n(p)+ well 464 are disposed in the HVN(P)– doped well 460, while a source n(p)– well 472 and an adjacent source n(p)+ well 474 are disposed in the HVP (N)D well 470. The LV N(P)MOS device 451 additionally comprises shallow trench isolation regions 456 adjacent to the layer having the p(n) well 454, the HVN(P)– doped well 460, and the HVP(N)D well 470. A bulk p(n)+ well 476 disposed in the HVP(N)D well 470 defines a contact point for a bulk region 492. The LV n(p)MOS semiconductor device 451 is additionally defined by a gate region 490, a source region 494, and a drain region 496.

Figure 10:
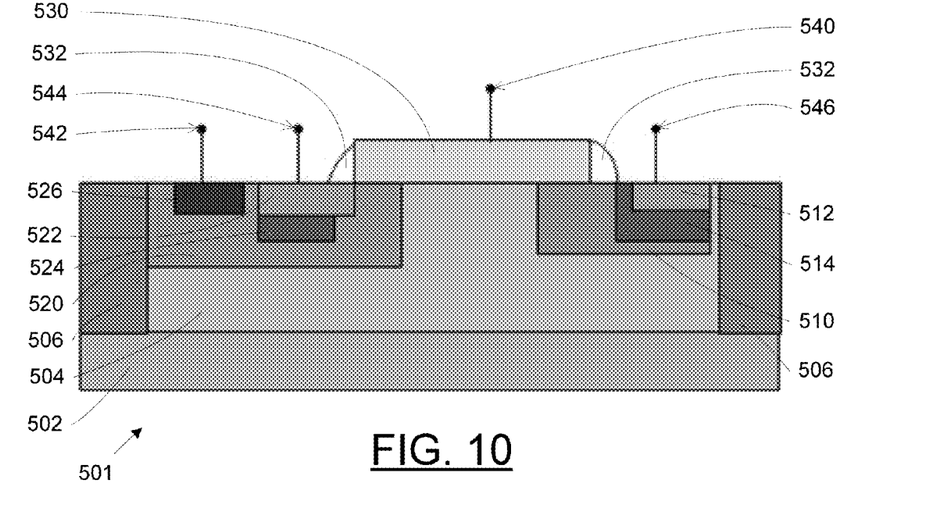
FIG. 10 is a cross-sectional view of a LV n(p)MOS device according to another embodiment of the invention.

FIG. 10 is a cross-sectional view of a LV n(p)MOS device according to another embodiment of the invention. The LV n(p)MOS device 501 comprises a silicon on insulation layer 502, a p(n) well 504, a conductive layer 530 having adjacent spacers 532, a HVN(P)– doped well 510, and a HVP(N)D well 520. A drain n(p)– well 512 and an adjacent drain n(p)+ well 514 are disposed in the HVN(P)– doped well 510, while a source n(p)– well 522 and an adjacent source n(p)+ well 524 are disposed in the HVP(N)D well 520. The LV n(p)MOS device 501 additionally comprises shallow trench isolation regions 506 adjacent to the layer having the p(n) well 504, the HVN(P)– doped well 510, and the HVP(N)D well 520. A bulk p(n)+ well 526 disposed in the HVP(N)D well 520 defines a contact point for a bulk region 542. The LV n(p) MOS semiconductor device 501 is additionally defined by a gate region 540, a source region 544, and a drain region 546.

Figure 11A:
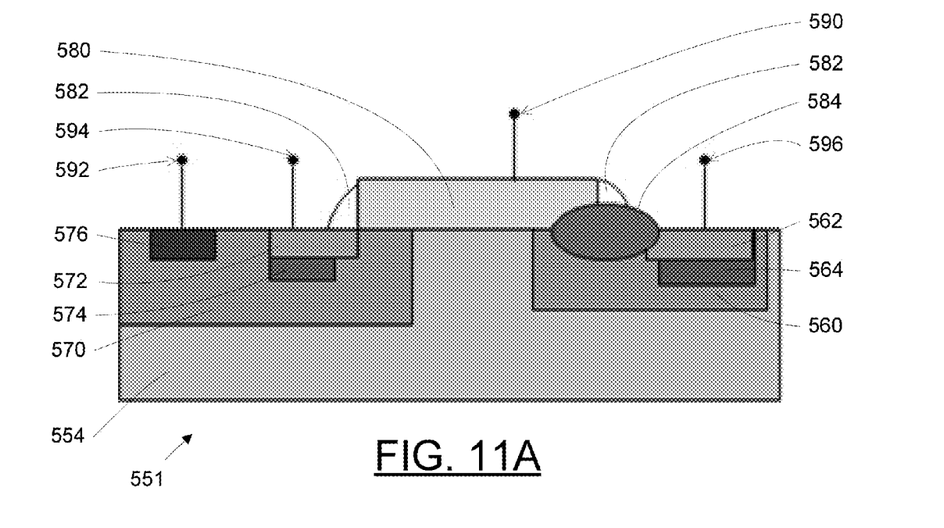
FIG. 11A is a cross-sectional view of a lateral diffusion n(p)-channel metal oxide semiconductor (LD n(p)MOS) device according to an embodiment of the invention.
Figure 11B:
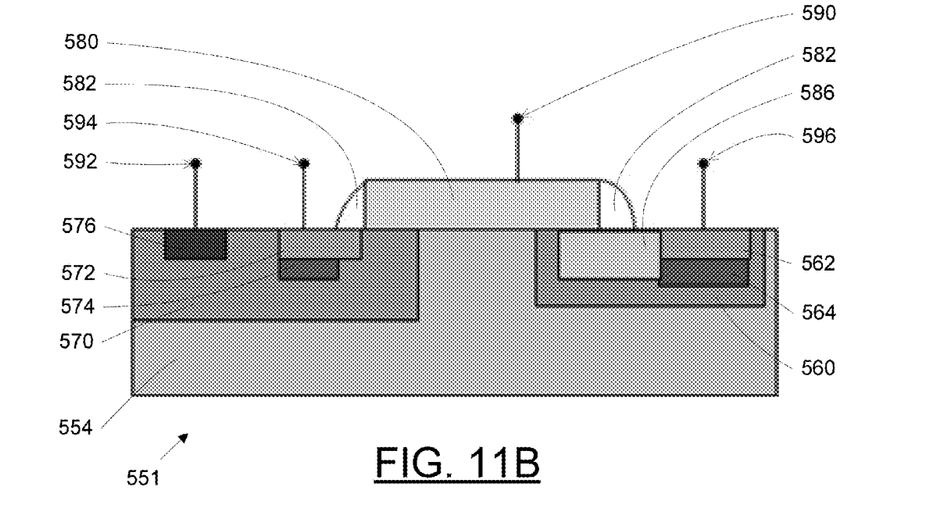
FIG. 11B is a cross-sectional view of a LD n(p)MOS device according to an embodiment of the invention.

FIGS. 11A and 11B are cross-sectional views of a lateral diffusion n(p)-channel metal oxide semiconductor (LD n(p) MOS) device according to an embodiment of the invention. As shown in FIG. 11A, the LD n(p)MOS device 551 comprises a p(n) well 554, a conductive layer 580 having adjacent spacers 582, a field oxide (FOX) layer 584, a HVN(P)– doped well 560, and a HVP(N)D well 570. A drain n(p)– well 562 and an adjacent drain n(p)+ well 564 are disposed in the HVN(P)– doped well 560, while a source n(p)– well 572 and an adjacent source n(p)+ well 574 are disposed in the HVP (N)D well 570. A bulk p(n)+ well 576 disposed in the HVP (N)D well 570 defines a contact point for a bulk region 592. The LD n(p)MOS semiconductor device 551 is additionally defined by a gate region 590, a source region 594, and a drain region 596. FIG. 11B shows a cross-sectional view of the LD n(p)MOS device 551 in another section of the device. This section shows a shallow trench isolation (STI) region 596 disposed in the in the HVN(P)– doped well 560 adjacent to the drain n(p)– well 562 and the drain n(p)+ well 564.

Figure 12A:
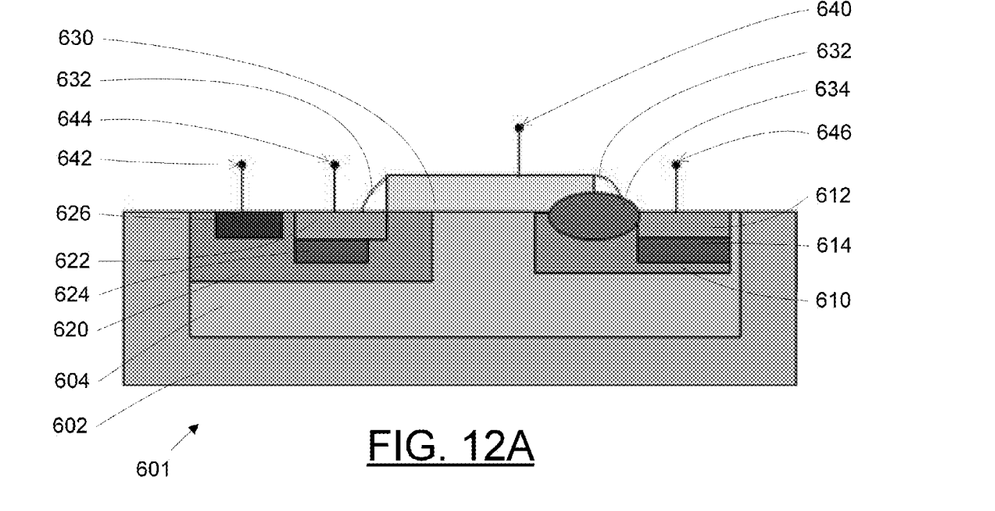
FIG. 12A is a cross-sectional view of a LD n(p)MOS device according to another embodiment of the invention.
Figure 12B:
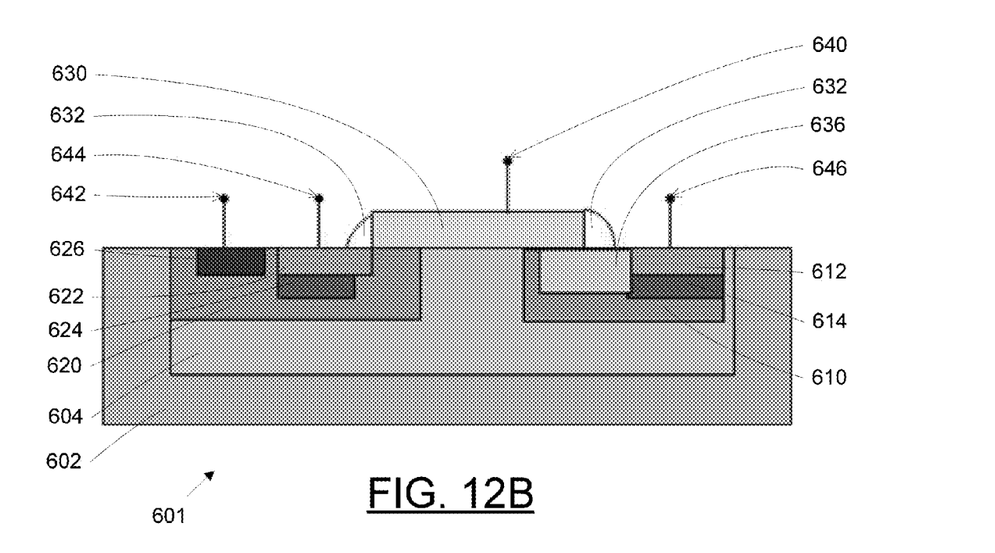
FIG. 12B is a cross-sectional view of a LD n(p)MOS device according to another embodiment of the invention.

FIGS. 12A and 12B are cross-sectional views of a LD n(p)MOS device according to another embodiment of the invention. As shown in FIG. 12A, the LD n(p)MOS device 601 comprises a deep n(p) well 602 that may be implanted using any one or both of a thermal diffusion process and a high energy process, a p(n) well 604, a conductive layer 630 having adjacent spacers 632, a field oxide (FOX) layer 634, a HVN(P)– doped well 610, and a HVP(N)D well 620. A drain n(p)– well 612 and an adjacent drain n(p)+ well 614 are disposed in the HVN(P)– doped well 610, while a source n(p)– well 622 and an adjacent source n(p)+ well 624 are disposed in the HVP(N)D well 620. A bulk p(n)+ well 626 disposed in the HVP(N)D well 620 defines a contact point for a bulk region 642. The LD n(p)MOS semiconductor device 601 is additionally defined by a gate region 640, a source region 644, and a drain region 646. FIG. 12B shows a cross-sectional view of the LD n(p)MOS device 601 in another section of the device. This section shows a shallow trench isolation (STI) region 646 disposed in the in the HVN(P)– doped well 610 adjacent to the drain n(p)– well 612 and the drain n(p)+ well 614.

Figure 13A:
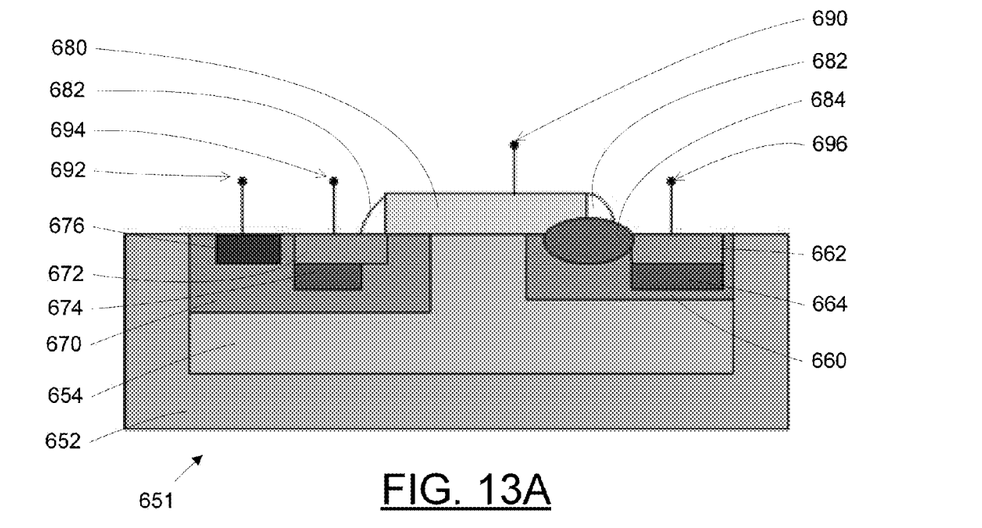
FIG. 13A is a cross-sectional view of a LD n(p)MOS device according to another embodiment of the invention.
Figure 13B:
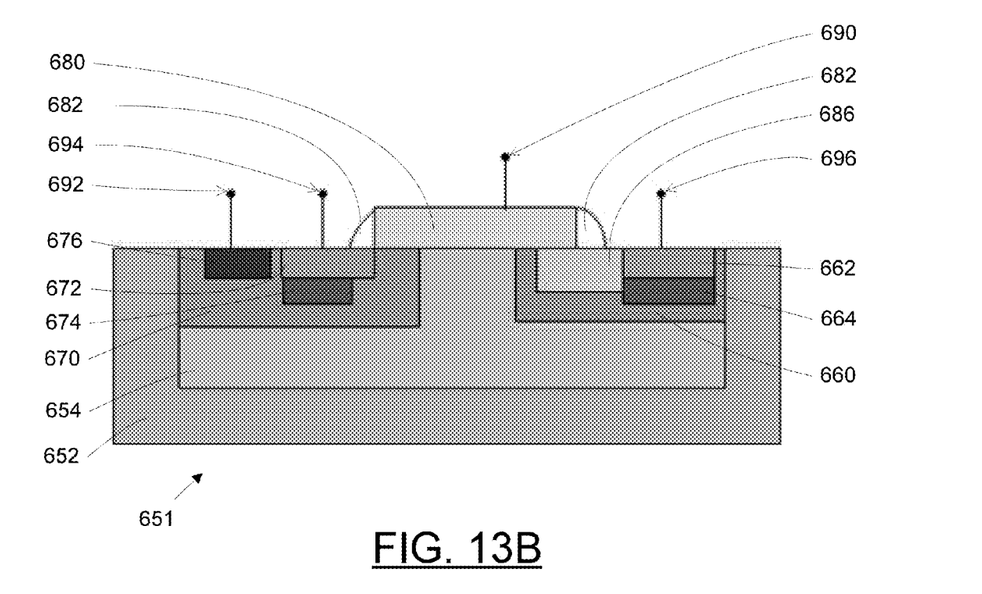
FIG. 13B is a cross-sectional view of a LD n(p)MOS device according to another embodiment of the invention.

FIGS. 13A and 13B are cross-sectional views of a LD n(p)MOS device according to another embodiment of the invention. As shown in FIG. 13A, the LD n(p)MOS device 651 comprises an n(p) epitaxy layer or some other n(p) type barrier layer 652, a p(n) well 654, a conductive layer 680 having adjacent spacers 682, a field oxide (FOX) layer 684, a HVN(P)– doped well 660, and a HVP(N)D well 670. A drain n(p)– well 662 and an adjacent drain n(p)+ well 664 are disposed in the HVN(P)– doped well 660, while a source n(p)– well 672 and an adjacent source n(p)+ well 674 are disposed in the HVP(N)D well 670. A bulk p(n)+ well 676 disposed in the HVP(N)D well 670 defines a contact point for a bulk region 692. The LD n(p)MOS semiconductor device 651 is additionally defined by a gate region 690, a source region 694, and a drain region 696. FIG. 13B shows a cross-sectional view of the LD n(p)MOS device 651 in another section of the device. This section shows a shallow trench isolation (STI) region 686 disposed in the in the HVN(P)– doped well 660 adjacent to the drain n(p)– well 662 and the drain n(p)+ well 664.

Figure 14A:
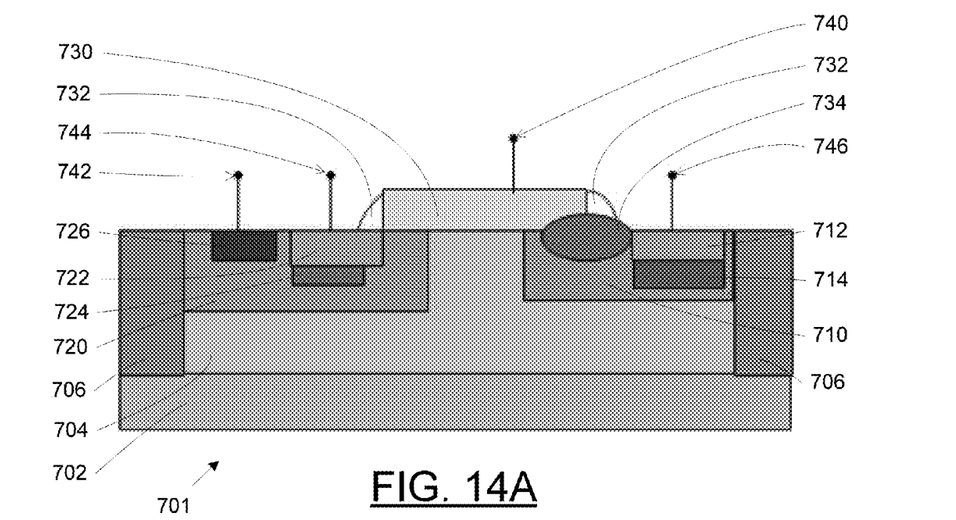
FIG. 14A is a cross-sectional view of a LD n(p)MOS device according to another embodiment of the invention.
Figure 14B:
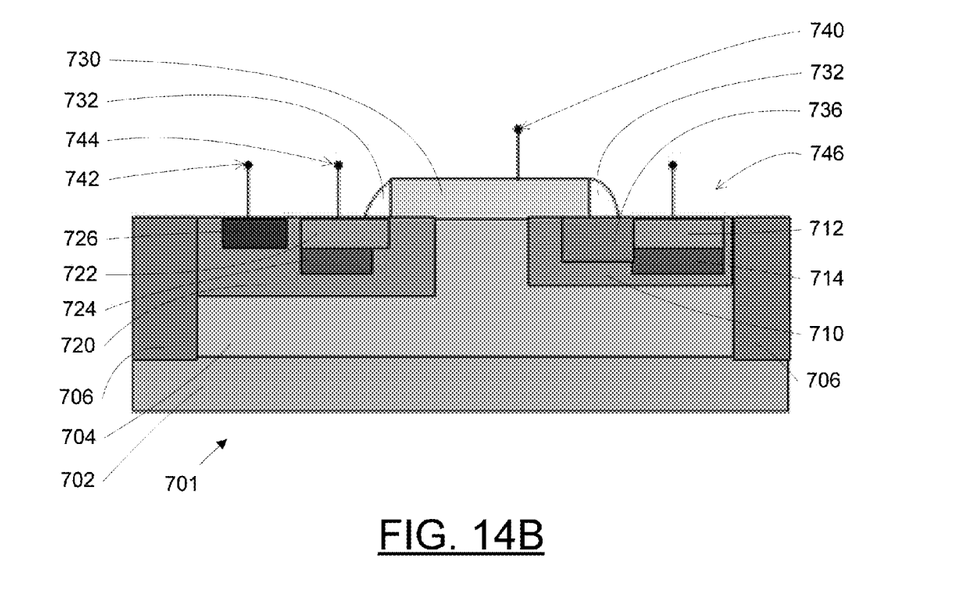
FIG. 14B is a cross-sectional view of a LD n(p)MOS device according to another embodiment of the invention.

FIGS. 14A and 14B are cross-sectional views of a LD n(p)MOS device according to another embodiment of the invention. As shown in FIG. 14A, the LD n(p)MOS device 701 comprises an n(p) epitaxy layer or some other n(p) type barrier layer 702, a p(n) well 704, a conductive layer 730 having adjacent spacers 732, a field oxide (FOX) layer 734, a HVN(P)– doped well 710, and a HVP(N)D well 720. A drain n(p)– well 712 and an adjacent drain n(p)+ well 714 are disposed in the HVN(P)– doped well 710, while a source n(p)– well 722 and an adjacent source n(p)+ well 724 are disposed in the HVP(N)D well 720. The LD n(p)MOS device 701 additionally comprises shallow trench isolation regions 706 adjacent to the layer having the p(n) well 704, the HVN (P)– doped well 710, and the HVP(N)D well 720. A bulk p(n)+ well 726 disposed in the HVP(N)D well 720 defines a contact point for a bulk region 742. The LD n(p)MOS semiconductor device 701 is additionally defined by a gate region 740, a source region 744, and a drain region 746. FIG. 14B shows a cross-sectional view of the LD n(p)MOS device 701 in another section of the device. This section shows another shallow trench isolation (STI) region 736 disposed in the in the HVN(P)– doped well 710 adjacent to the drain n(p)– well 712 and the drain n(p)+ well 714.

Figure 15A:
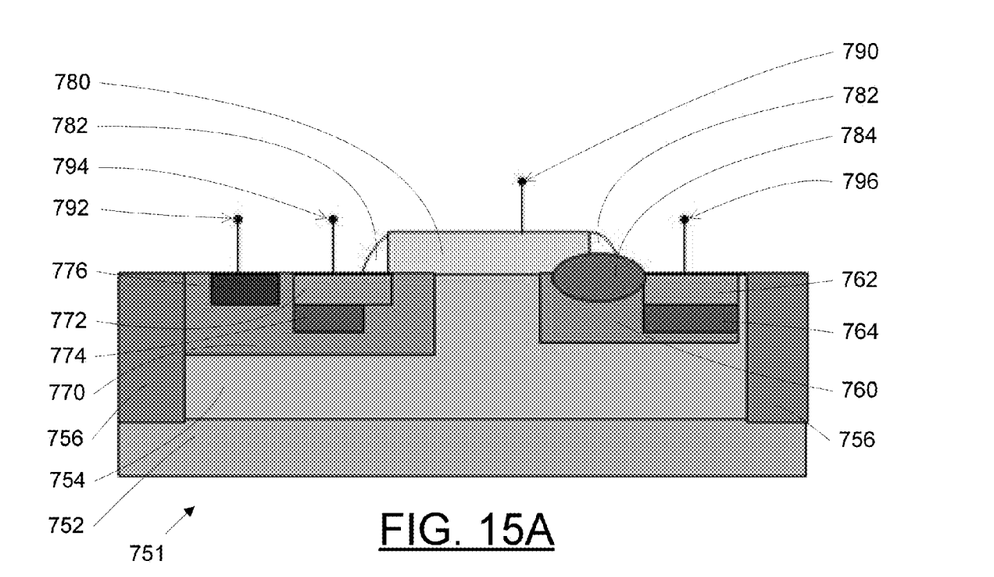
FIG. 15A is a cross-sectional view of a LD n(p)MOS device according to another embodiment of the invention.
Figure 15B:
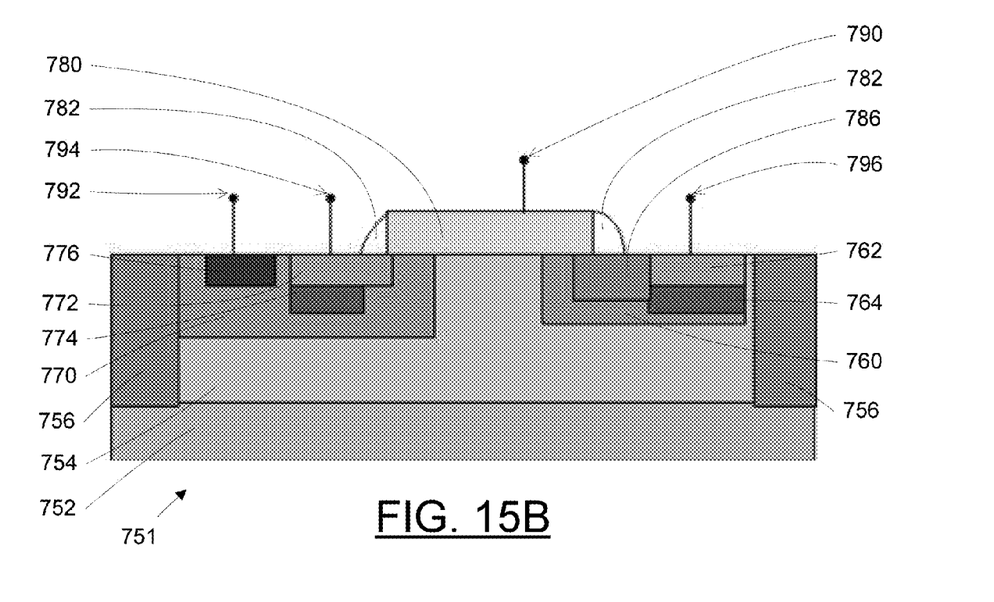
FIG. 15B is a cross-sectional view of a LD n(p)MOS device according to another embodiment of the invention.

FIGS. 15A and 15B are cross-sectional views of a LD n(p)MOS device according to another embodiment of the invention. As shown in FIG. 15A, the LD n(p)MOS device 751 comprises a silicon on insulation layer 752, a p(n) well 754, a conductive layer 780 having adjacent spacers 782, a field oxide (FOX) layer 784, a HVN(P)– doped well 760, and a HVP(N)D well 770. A drain n(p)– well 762 and an adjacent drain n(p)+ well 764 are disposed in the HVN(P)– doped well 760, while a source n(p)– well 772 and an adjacent source n(p)+ well 774 are disposed in the HVP(N)D well 770. The LD n(p)MOS device 751 additionally comprises shallow trench isolation regions 756 adjacent to the layer having the p(n) well 754, the HVN(P)– doped well 760, and the HVP (N)D well 770. A bulk p(n)+ well 756 disposed in the HVP (N)D well 770 defines a contact point for a bulk region 792. The LD n(p)MOS semiconductor device 751 is additionally defined by a gate region 790, a source region 794, and a drain region 796. FIG. 15B shows a cross-sectional view of the LD n(p)MOS device 751 in another section of the device. This section shows another shallow trench isolation (STI) region 786 disposed in the in the HVN(P)– doped well 760 adjacent to the drain n(p)– well 762 and the drain n(p)+ well 764.

Further pursuant to the embodiments identified in FIGS. 6, 7, 8, 9, 10, 11A, 11B, 12A, 12B, 13A, 13B, 14A, 14B, 15A, and 15B, the distance between a terminal edge of the conductive layer adjacent to an edge of the drain n(p)– well may be established pursuant to the disclosure provided herein to provide a distinct on resistance at breakdown voltage.

An aspect of the invention provides methods of fabricating semiconductor device of the invention. Any manufacturing process known to those having ordinary skill in the art having the benefit of this disclosure may be used to manufacture the semiconductor devices of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor device comprising:
   a substrate;
   a well in the substrate;
   a p well implant bounded at least in part within the substrate by the well;
   a conductive layer disposed on the substrate;
   a high voltage n–(HVN–) doped well implanted in the p well implant extending into a part of the substrate that underlies a portion of the conductive layer;
   a high voltage p doped (HVPD) well implanted in the p well implant extending into another part of the substrate that underlies another portion of the conductive layer, the HVPD well diametrically opposed to the HVN– doped well; and
   a drain n– well implanted in the HVN– doped well.

2. The semiconductor device of claim 1, additionally comprising a source n– well implanted in the HVPD well.

3. The semiconductor device of claim 2, additionally comprising a source n+ well implanted in the HVPD well adjacent to the source n– well.

4. The semiconductor device of claim 2, additionally comprising a bulk p+ well implanted in the HVPD well.

5. The semiconductor device of claim 1, wherein the well is any one of a deep n well implant, an n type epitaxy layer, and an n type barrier layer.

6. The semiconductor device of claim 5, additionally comprising shallow trench isolation regions adjacent to the p well implant.

7. The semiconductor device of claim 1, wherein the substrate and the well is a silicon on insulation structure.

8. The semiconductor device of claim 7, additionally comprising shallow trench isolation regions adjacent to the p well implant.

9. The semiconductor device of claims 1, wherein a distance between an edge of the conductive layer and an adjacent edge of the drain n– well is at least about 0.45 µm.

10. The semiconductor device of claim 1, additionally comprising a drain n+ well implanted in the HVN– doped well adjacent to the drain n– well.

11. A semiconductor device comprising:
    a substrate;
    a well;
    an n well implant bounded within the substrate by the well;
    a conductive layer disposed on the substrate;
    a high voltage p– (HVP–) doped well implanted in the n well implant extending into a part of the substrate that underlies a portion of the conductive layer;
    a high voltage n doped (HVND) well implanted in the n well implant extending into another part of the substrate that underlies another portion of the conductive layer, the HVND well diametrically opposed to the HVP– doped well;
    a drain p– well implanted in the HVP– doped well; and
    a source p– well implanted in the HVND well.

12. The semiconductor device of claim 11, wherein the well is any one of a deep p well implant, a p type epitaxy layer, and a p type barrier layer.

13. The semiconductor device of claim 12, additionally comprising shallow trench isolation regions adjacent to the n well implant.

14. The semiconductor device of claim 11, wherein the substrate and the well is a silicon on insulation structure.

15. The semiconductor device of claim 14, additionally comprising shallow trench isolation regions adjacent to the n well implant.

16. The semiconductor device of claim 11, wherein a distance between an edge of the conductive layer and an adjacent edge of the drain p– well is at least about 0.45 μm.

17. A method of fabricating a semiconductor device comprising:
providing any one of a substrate having a deep n well, a substrate having an n type epitaxy well, a substrate having an n type barrier layer, and a silicon on insulator substrate structure;
forming a deep n well implant in the substrate;
forming a p well implant in the substrate, the p well implant diametrically opposed to the deep n well implant;
disposing a conductive layer on the substrate;
implanting an n– type ion in the p well implant to form a high voltage n– (HVN–) doped well;
implanting a p type ion in the p well implant to form a high voltage p doped (HVPD) well;
implanting a drain n– well into the HVN– doped well; and
implanting a source n– well into the HVPD well.

18. The method of claim 17, wherein implanting an n– type ion in the p well additionally comprising implanting the n– type ion in the p well at a first tilt angle and implanting a p type ion in the p well additionally comprising implanting the p type ion in the p well at a second tilt angle.

19. The method of claim 18, wherein the first tilt angle is from about 15 degrees to about 45 degrees and the second tilt angle is from about 15 degrees to about 45 degrees.

20. The method of claim 17, wherein the drain n– well is implanted into the HVN– doped well at a distance of at least about 0.45 μm from an adjacent edge of the conductive layer.

21. The method of claim 17, additionally comprising implanting a p+ type ion to form a drain p+ well adjacent to the drain n– well and to form a source p+ well adjacent to the source n– well.

* * * * *